United States Patent [19]

Sokoloski

[11] 4,313,782
[45] Feb. 2, 1982

[54] METHOD OF MANUFACTURING SUBMICRON CHANNEL TRANSISTORS

[75] Inventor: Joseph C. Sokoloski, East Brunswick, N.J.

[73] Assignee: RCA Corporation, New York, N.Y.

[21] Appl. No.: 94,215

[22] Filed: Nov. 14, 1979

[51] Int. Cl.³ .......................................... H01L 21/308
[52] U.S. Cl. ..................................... 156/628; 29/571;
156/653; 156/657; 156/661.1; 156/662; 357/54;
357/59; 427/94; 427/399
[58] Field of Search ............... 156/628, 643, 653, 657,
156/662, 659.1, 661.1; 29/571; 148/187;
427/94, 399; 357/54, 59

[56] References Cited

U.S. PATENT DOCUMENTS

| 3,738,880 | 6/1973 | Laker | 156/628 |
| 3,783,047 | 1/1974 | Paffen et al. | 148/187 |
| 3,903,325 | 9/1975 | Horiuchi | 427/399 |
| 3,967,981 | 7/1976 | Yamazaki | 148/187 |
| 4,051,273 | 9/1977 | Abbas et al. | 427/94 |
| 4,124,833 | 11/1978 | Nicholas | 148/187 |
| 4,151,537 | 4/1979 | Goldman et al. | 357/59 |
| 4,162,504 | 7/1978 | Hsu | 357/54 |
| 4,201,603 | 5/1980 | Scott et al. | 156/628 |

FOREIGN PATENT DOCUMENTS 2723501 11/1978 Fed. Rep. of Germany ........ 427/94
4831034  9/1973 Japan ..................................... 427/94

OTHER PUBLICATIONS

Baker et al., "Field Effect Transistor", IBM Technical Disclosure Bulletin, vol. 11, No. 7 (12/68), p. 849.

Primary Examiner—Jerome W. Massie
Attorney, Agent, or Firm—Birgit E. Morris; Donald S. Cohen; Lawrence P. Benjamin

[57] ABSTRACT

A method for fabricating a submicron short channel MOS device is described wherein a plural or multilevel insulator layer, having a thickness of about 100-200 angstroms, is interposed between the polycrystalline silicon gate member and the substrate to function as a gate insulator and in addition, serving to protect the body of the semiconductor from becoming inadvertently doped during the processing steps.

5 Claims, 9 Drawing Figures

METHOD OF MANUFACTURING SUBMICRON CHANNEL TRANSISTORS

The Government has rights in this invention pursuant to Contract No. DAAB07-78-C-2978, awarded by the Department of the Army.

BACKGROUND OF THE INVENTION

This invention relates to semiconductor processing and more particularly, to an improved method of manufacturing a submicron channel MOS polycrystalline silicon gate transistor.

The use of polycrystalline silicon material (polysilicon) as the gate member for a MOS transistor or as an interconnection between MOS transistors and other electrical components of an integrated circuit is both well-known and highly desirable in the semiconductor art. In the past, the dimensions of either polysilicon gates or interconnects were defined using standard photolithographic techniques which, of necessity, serve to limit the narrowness that can be achieved.

An early technique which was developed to define the dimensions of polysilicon gate is described in U.S. Pat. No. 3,738,880 to A. Laker which issued on June 13, 1973, entitled "METHOD OF MAKING SEMICONDUCTOR DEVICE". In this reference, a P-type dopant is diffused into a polysilicon layer through an opening in a masking layer in order to form a doped strip or line in the polysilicon layer. After removing the mask layer, only the doped portion of the polysilicon layer is selectively removed by an etchant which does not attack the doped strip or line. The net result is the production of a doped polysilicon strip or line in the desired pattern. However, the narrowness of the strip or line which is formed by the Laker technique is limited due to the fact that photolithography was used to form the opening in the masking layer and because the dopant, when diffused into a polysilicon layer, spreads laterally to form the doped line. Thus, the doped strip or line is wider than the opening in the masking layer which defined the doped line.

A recent method of manufacturing a narrow gate line is described in U.S. Pat. No. 4,124,933 to K. Nicholas, which issued on Nov. 14, 1978, entitled "METHOD OF MANUFACTURING SEMICONDUCTOR DEVICE". In this latter reference, a gate is formed having a relatively narrow line by laterally diffusing a boron dopant into a portion of a polysilicon layer at the edges thereof. This is accomplished by providing a silicon body with a relatively thick layer of silicon dioxide which will subsequently form the gate oxide for the device. Thereafter, a layer of polysilicon is applied on top of the gate oxide followed by successive layer of silicon nitride and a masking oxide. Using the masking oxide as a mask for the nitride layer, the nitride layer is etched to expose portions of the surface of the polysilicon layer and the now exposed portions of the surface of the polysilicon layer are then etched down to the gate oxide layer. The next step is the diffusion of boron into the exposed edges of polysilicon after which the nitride layer, and the undoped polysilicon layers are removed by suitable etchants.

One difficulty that arises in the Nicholas process resides in the fact that Nicholas requires a relatively thick layer of gate oxide of the order of about 0.1 micron (1,000 angstroms) thick. The need for the thick oxide arises when, for example, a boron nitride source is used for the diffusion of boron into the polysilicon layer. In addition to doping the edges of the polysilicon layer, a boron doped oxide is also formed on the exposed gate oxide layer. Thereafter, when removing the boron doped oxide from the surfaces, it is extremely likely that portions of the gate oxide layer will also be etched, thus exposing the semiconductor body. To prevent this from happening and also to prevent the boron from doping the body of semiconductor material through the opening, a thick oxide layer, of the order of about 1,000 angstroms is thus necessary. However, this is undesirable in situations where it is necessary to form the gate oxide to a thickness of about 100-200 angstroms or about one order of magnitude thinner than Nicholas.

The need for gate insulators having thicknesses in the 100-200 angstroms rage, for example, is described in U.S. Pat. No. 4,162,504 to S. T. Hsu, which issued July 24, 1979 and entitled "FLOATING GATE SOLID-STATE STORAGE DEVICE" and in Ser. No. 946,722, filed Sept. 28, 1978 and entitled "ELECTRICALLY PROGRAMMABLE FLOATING GATE READ ONLY MEMORY DEVICE AND METHOD FOR MAKING SAME". Still another floating gate device that would utilize a gate insulator having a thickness of about 100-200 angstroms is U.S. Application Ser. No. 086,313, filed Oct. 17, 1979 and entitled "IMPROVED GATE INJECTED FLOATING GATE AND MEMORY DEVICE" in which a novel floating gate device has charge injected into the floating gate from the control gate in order to maintain the integrity of the gate insulator.

SUMMARY OF THE INVENTION

In accordance with the principles of the subject invention, there is described a method of producing a narrow gate device having a thinner layer of gate insulator than is heretofore possible in the prior art. In the subject application, layers of gate insulator having a thickness of about 100-200 angstroms is formed on a silicon substrate. Thereafter, a layer of polysilicon is deposited over the gate insulators. Portions of the polysilicon layer will, in the final analysis, be formed into the gate member or the floating gate, whichever is desired. As distinguished from the prior art, the processing steps do not affect the operation of the gate insulator under the gate member and the gate insulator layer serves to further protect the underlying body of silicon from being prematurely doped to the detriment of the finished device.

DETAILED DESCRIPTION OF THE INVENTION

Figure 1:
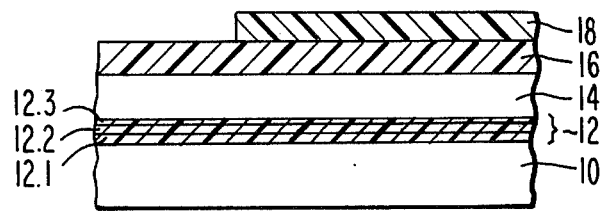
FIGS. 1-9 are cross sectional views of various stages of the processing utilized in my invention.
Figure 2:
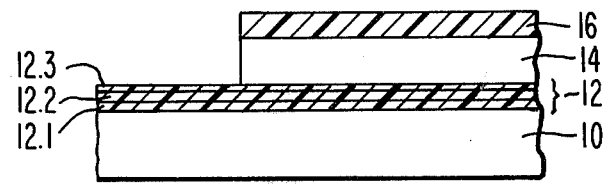
Figure 3:
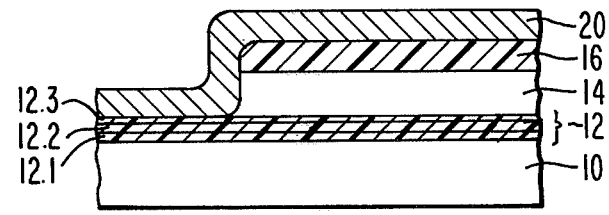
Figure 4:
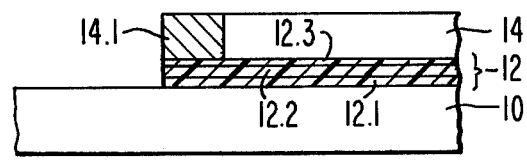

Referring now to FIGS. 1-9, it will be seen in FIG. 1 that silicon substrate 10 has a first insulating layer 12 grown thereon to a thickness of about 100-200 angstroms. While the prior art indicates this insulating layer may be a single thick (1,000 angstroms) layer of silicon dioxide, it is preferable to use a plural or multilevel layer insulator in place thereof. This plural level layer consists of about 50-100 angstroms of silicon dioxide layer 12.1 thermally grown in steam at about 900° C. adjacent substrate 10 followed by about 50-100 angstroms of silicon nitride layer 12.2 grown from the reaction of dichlorosilane and ammonia at about 800° C. and about 15–20 angstroms of thermally grown silicon dioxide layer 12.3. This insulating layer 12 is followed by a layer of polysilicon 14 having a thickness of about 3,500 angstroms and grown from a chemical vapor deposition (CVD) technique. This is followed by a layer of masking oxide 16 having a thickness of about 1,500 angstroms which may also be formed by a CVD process. The next step is the deposition of a layer of photoresistive material 18 which has been patterned by utilizing any one of many techniques to produce the desired pattern in layer 18. The function of layer 18 is to produce a mask for the subsequent etching of masking oxide layer 16. Having etched the portion of exposed masking oxide layer 16 in a buffered HF etch solution, photoresist mask 18 is removed and polysilicon layer 14 is etched in a KOH solution to produce the structure as shown in FIG. 2. At this juncture, a boron deposition or diffusion is carried on wherein a boron bearing glass layer 20 is formed by heating boron nitride to about 900° C. in a nitrogen ambient. Thus, layer 20 is formed over the entire structure and most especially, in contact with the now vertically etched, exposed edge of polysilicon layer 14. However, the presence of multilevel layer 12 prevents substrate 10 from being doped with boron. The diffusion time and temperature utilized to drive the boron dopant into the edge of polysilicon layer 14 wll be determined by the depth of penetration that is required for the device and will subsequently determine the width of the gate member. When the boron dopant has penetrated the edge of the polysilicon layer the required distance, the diffusion processing is terminated. The boron deposition vehicle in the form of boron glass layer 20 is now removed using a buffered HF solution resulting in the structure shown in FIG. 4 wherein the section labeled 14.1 now represents boron doped polysilicon while the unshaded portion labeled 14 represents the undoped polysilicon. During the edge doping step, oxide layer 16 becomes heavily doped with boron. The HF etchant that is used to remove layer 20 is also used to remove layers 16 and any portion of multilevel layer 12 (12.1, 12.2 and 12.3) that is not covered by layer 14.

Figure 5:
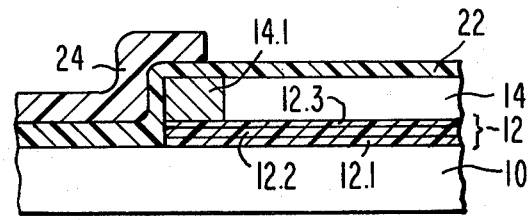
Figure 6:
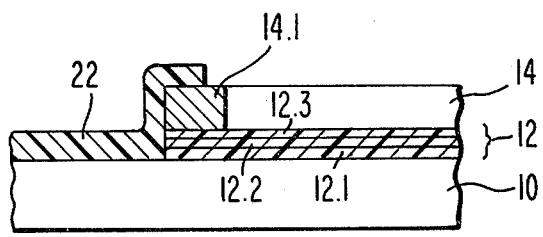
Figure 7:
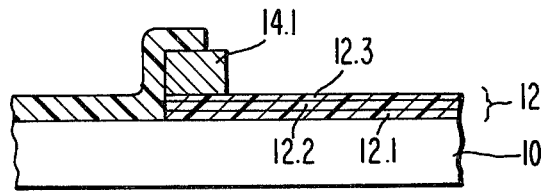

Processing is now continued by growing oxide masking layer 22 having a thickness of about 1,000–1,500 angstroms, by a CVD process, over both the doped and undoped portions of polysilicon layer 14, 14.1 as well as over the exposed portion of substrate 10 and, thereafter, providing a patterned photoresist layer 24 over the areas to be protected as shown in FIG. 5. As shown in FIG. 6, the unmasked portion of oxide layer 22 is removed to expose the undoped portion 14 of the polysilicon layer. At this stage, as shown in FIG. 7, the structure is subjected to a selective etch using, for example, the solvents or etchants described in the aforementioned Laker or Nicholas references. Such solvents include aqueous hydrazine or potassium hydroxide-propanol solutions and the like. The use of any of these solutions will selectively remove only the undoped portions of polysilicon layer 14, 14.1 leaving doped polysilicon strip 14.1 unaffected.

Figure 8:
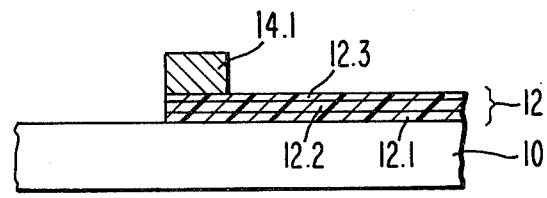
Figure 9:
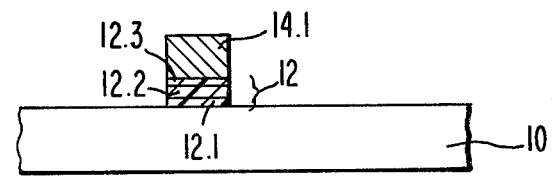

As shown in FIG. 7, the structure now consists of substrate 10, portions of gate insulator 12 (which was under the undoped polysilicon portion 14) doped strip 14.1 and masking oxide layer 22 which partially covers the gate member, as well as the previously exposed portion of substrate 10. As shown in FIG. 8, oxide layer 22 is now removed from the top of polysilicon strip 14.1 using a buffered HF etchant. Plural level layer 12 is then removed by first removing the nitride layer with a phosphoric acid etch followed by a buffered HF etch to remove any silicon oxide remaining from the plural level layer 12, resulting in the structure shown in FIG. 9. At this stage, the device is now ready to be processed to form, for example, a narrow gate or floating gate device having a thin gate insulator.

While the foregoing exegisis has been described in terms of a bulk silicon device, it should now be obvious to those skilled in the art that the same processing steps may be used to form a narrow gate or narrow floating gate device on a sapphire substrate. In this latter case, silicon islands are formed using well-known techniques on a sapphire surface. Once the silicon islands are formed, the processing steps will follow as previously described with respect to a bulk silicon device.

Further, while sapphire is preferred, other similar insulative substrates such as monocrystalline beryllium oxide or spinel may be used as a suitable insulating substrate without departing from the inventive concept.

What is claimed is:

1. A method of manufacturing a semiconductor device, comprising the steps of:

providing a semiconductor body having a boundary surface;

growing a first layer of oxide on the boundary surface;

depositing a layer of silicon nitride on the oxide layer;

growing a second layer of silicon oxide on the nitride layer;

depositing a layer of polycrystalline silicon on the oxide layer;

depositing a layer of apertured masking material on the polycrystalline silicon layer;

etching unmasked portions of the polycrystalline silicon layer to expose the unetched edges of the polycrystalline silicon material under the masking layer;

doping the exposed edges of the unetched polycrystalline silicon layer to form a narrow line of doped polycrystalline silicon in the polycrystalline silicon layer, the doping step forming a doped oxide on the apertured masking material and exposed second oxide layer;

etching the doped oxide, the apertured masking material, and the exposed portions of the plural level insulator layer to expose the doped and undoped portions of the polycrystalline silicon layer and unmasked portions of the silicon body;

forming a second masking layer over the doped and undoped portions of the polycrystalline silicon layer and over the exposed portions of the silicon body;

forming a third apertured masking layer over selected portions of the second masking layer to mask at least the doped portions of the polycrystalline silicon layer and the exposed portions of the silicon body;

etching the exposed portions of the second masking layer to expose only the undoped portions of the polysilicon layer;

selectively etching the undoped portions of the polycrystalline silicon layer;

removing the second and third masking layers to expose the masked portions of the silicon body and the plural insulator layer; and removing the remaining exposed portions of the plural insulator layer.

2. The method in accordance with claim 1 comprising the further steps of:
   providing a substrate of insulative material selected from the group consisting of sapphire, monocrystalline beryllium and spinel; and
   forming the silicon body on the insulative substrate.

3. The method in accordance with claims 1 or 2, in which: the first and second layers of oxide and the nitride layer have a total thickness of about 100–200 angstroms.

4. The method in accordance with claim 3, in which: the first oxide layer is a thermally grown silicon oxide having a thickness of about 50–100 angstroms.

5. The method in accordance with claim 4, in which: the silicon nitride layer has a thickness of about 50–100 angstroms; and
   the second silicon oxide layer has a thickness of about 15–20 angstroms.

* * * * *

UNITED STATES PATENT AND TRADEMARK OFFICE
CERTIFICATE OF CORRECTION

PATENT NO. : 4,313,782

DATED : February 2, 1982

INVENTOR(S) : Joseph Chester Sokoloski

It is certified that error appears in the above-identified patent and that said Letters Patent is hereby corrected as shown below:

On the title page, Item [22] "Nov. 14, 1979" should read -- Nov. 19, 1979--

Signed and Sealed this

First Day of June 1982

[SEAL]

Attest:

Attesting Officer

GERALD J. MOSSINGHOFF

Commissioner of Patents and Trademarks